United States Patent [19]

Masuoka

[11] 4,069,495
[45] Jan. 17, 1978

[54] SEMICONDUCTOR DEVICE FOR INTEGRATED INJECTION LOGIC

[75] Inventor: Fujio Masuoka, Yokohama, Japan

[73] Assignee: Tokyo Shibaura Electric Co., Ltd., Tokyo, Japan

[21] Appl. No.: 729,772

[22] Filed: Oct. 5, 1976

[30] Foreign Application Priority Data

Oct. 13, 1975 Japan .................................. 50-123136

[51] Int. Cl.² ...................... H01L 27/02; H01L 27/04
[52] U.S. Cl. ........................................ 357/46; 357/44; 357/48; 357/89
[58] Field of Search ........................ 357/44, 46, 48, 89

[56] References Cited

U.S. PATENT DOCUMENTS 3,962,717  6/1976  O'Brien .................................. 357/44

Primary Examiner—Edward J. Wojciechowicz
Attorney, Agent, or Firm—Finnegan, Henderson, & Farabow & Garret

[57] ABSTRACT

A semiconductor device for integrated injection logic comprises a semiconductor substrate of a first conductivity type, a signal input region of a second conductivity type provided in the substrate, at least one signal output region of the first conductivity type formed in part of the surface of the signal input region, a charge injection region provided closely to the signal input region and forming a pn junction with the substrate and having a higher impurity concentration than the signal input region, and electrodes provided for the substrate, signal input region, signal output region, and charge injection region, respectively. The signal input region includes a first region of the second conductivity type, and a second region provided in at least part of the surface of the first region and having the same conductivity type as that of the first region and having a higher impurity concentration than the first region, said second region being adjoined directly to the signal output region and connected to the signal input electrode.

6 Claims, 14 Drawing Figures

FIG. 6
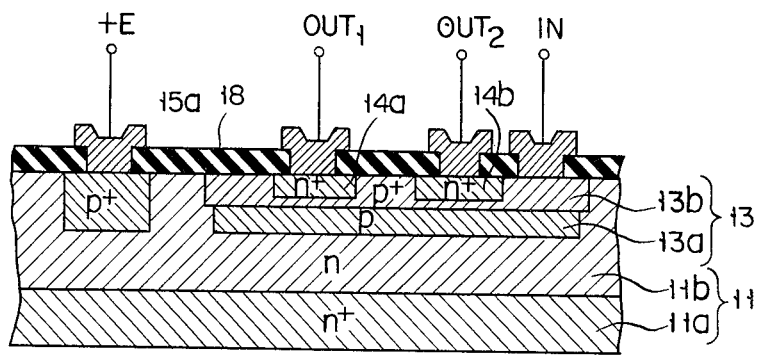
FIG. 7A
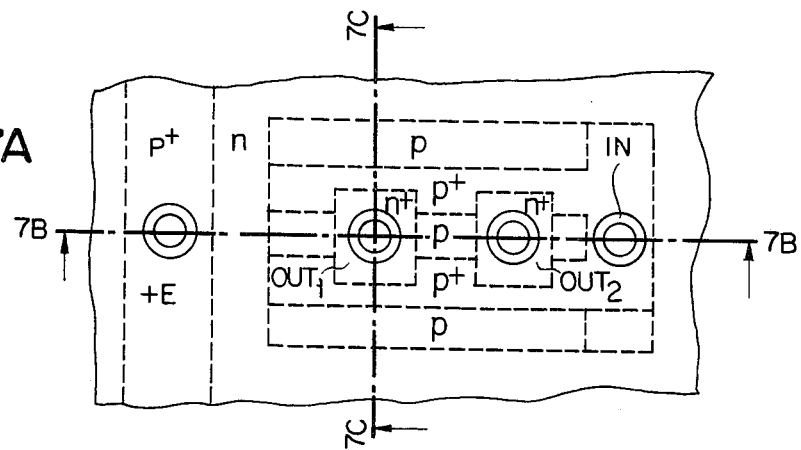
FIG. 7B
FIG. 7C
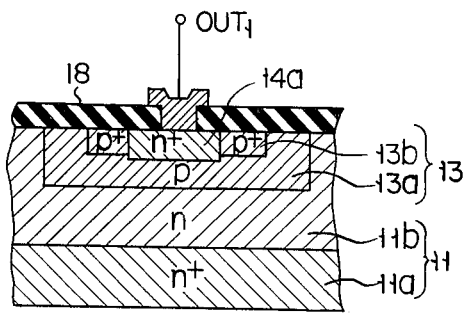

SEMICONDUCTOR DEVICE FOR INTEGRATED INJECTION LOGIC

BACKGROUND OF THE INVENTION

This invention relates to a semiconductor device including bipolar transistors, and more particularly to a semiconductor device for integrated injection logic capable of reducing the power consumption and the signal propagation delay time.

In the case of forming bipolar transistors into an IC, it is necessary to completely isolate them from each other. This, however, makes the resulting IC construction complicated, which renders also complicated the manufacturing process of IC, and in addition causes an increase in power consumption. Conventionally, therefore, difficulties are encountered in constructing bipolar transistors into an LSI (Large Scale Integrated circuit) as compared with the formation of MOS transistors into an LSI. Recently, however, a fundamental structure of I²L (Integrated Injection Logic) or MTL (merged Transistor Logic) has been exploited to render easier the formation of bipolar transistors into an LSI. According to this fundamental structure, through integrating ordinary planar bipolar transistors as upside-down operated transistors whose collector and emitter are constituted by the emitter and collector of those bipolar transistors, the isolation of the bipolar transistors from each other becomes unnecessary to cause not only an increase in the integrating density but also a decrease in the power consumption. The outline of the abovementioned fundamental structure will now be described by reference to FIGS. 1 and 2. Referring to FIG. 1, on an n+ substrate 1 connected to a ground terminal G an n layer 2 is formed, for example, by epitaxial growth method. In this n layer 2 a p layer 3 is formed by diffusion. Further, in this p layer 3, for example, two n+ layers 4a, 4b are formed by diffusion in a manner spaced from each other. Further, a p+ layer 5 is formed by diffusion in the n layer 2 in a manner adjacent the p layer 3. The p layer 3, n+ layers 4a, 4b, and p+ layer 5 are connected to an input terminal IN, output terminals OUT₁, OUT₂ and charge injection terminal +E, respectively. A semiconductor device shown in FIG. 1 can be represented by an equivalent circuit shown in FIG. 2, that is, a combined circuit of an npn transistor Q₁ and a pnp transistor Q₂. The npn transistor Q₁ is a multi-collector type upside-down operated transistor wherein the collector is constituted by the n+ layers 4a, 4b; the base by the p layer 3; and the emitter by the n layer 2. The pnp transistor whose emitter, base and collector use the p+ layer 5, n layer 2 and p layer 3, respectively. The pnp transistor Q₂ is intended to inject carriers into the base of the npn transistor Q₁ and is called "injector". The circuit of FIG. 2 is thus constructed such that the inverted signals OUT₁, OUT₂ of an input signal IN are obtained with a D.C. voltage of +E applied to the emitter of the transistor Q₂. The fundamental structure shown in FIG. 1, the equivalent circuit shown in FIG. 2 and the operation of the inverter are described in Wiedmann, S, "Injection-Coupled Memory". IEEEJ. Solid State Circuits, Vol, SC-8, No. 5, Oct. 1973, p332 to 337.

FIG. 5 shows the relationship between the mean power consumption and mean propagation delay time of the above-mentioned I²L. When consideration is given to a product of power consumption and delay time, the product with respect to the I²L is relatively small as compared with that with respect to a TTL (Transistor-Transistor-Logic), and coincides with a 1 P. J. (1 Pico Joule) line as indicated by a solid line in FIG. 5. But the delay time is saturated at a point of about 10 nanosecond. As a result, even when the power consumption was increased, the delay time could not be shortened any further.

Accordingly, it is the object of the invention to provide a semiconductor device for integrated injection logic capable of reducing the signal propagation delay time and the power consumption.

A semiconductor device of the invention comprises a semiconductor substrate of a first conductivity type, a signal input region of a second conductivity type provided in the substrate, at least one signal output region of the first conductivity type formed in the signal input region, a charge injection region provided closely to the signal input region and forming a pn junction with the substrate and having a high impurity concentration, and electrodes provided for the substrate, signal input region, signal output region, and charge injection region, respectively, whereby to obtain an inverted output of an input signal by applying a forward bias voltage to the pn junction, said signal input region including a first region of the second conductivity type having a lower impurity concentration than the charge injection region, and a second region provided in at least part of the surface of the first region and having the same conductivity type as that of the first region and having a higher impurity concentration than the first region, said second region being adjoined to the signal output region and connected to the signal input electrode.

According to the invention, the signal propagation delay time can be remarkably decreased by causing a large reduction in lateral resistance of the signal input region. Simultaneously, the linear decreasing characteristic of the propagation delay time relative to the power consumption is improved to provide a semiconductor device wherein the delay time is not saturated up to sub-nanosecond.

BRIEF DESCRIPTION OF THE DRAWING

FIG. 6 is a sectional view showing a first modification of the present device;

FIG. 7A is a plan view showing a second modification of the present device;

FIG. 7B is a sectional view on line 7B-7B of FIG. 7A;

FIG. 7C is a sectional view on line 7C-7C of FIG. 7A;

DETAILED DESCRIPTION OF THE PREFERRED EMBODIMENT

Figure 1:
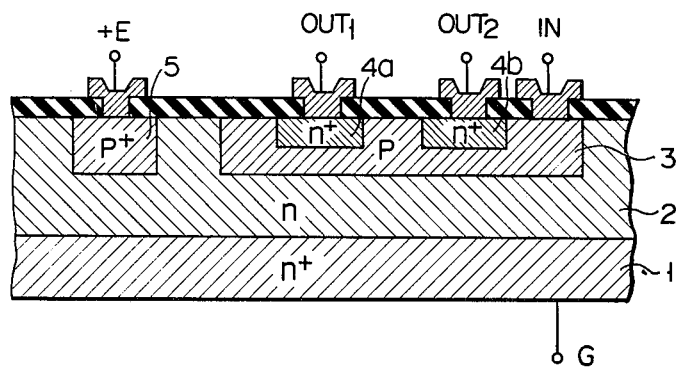
FIG. 1 is a sectional view of a prior art semiconductor device for integrated injection logic.
Figure 2:
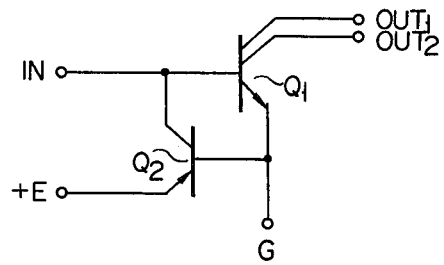
FIG. 2 is a circuit diagram showing an equivalent circuit of the semiconductor device shown in FIG. 1.
Figure 3:
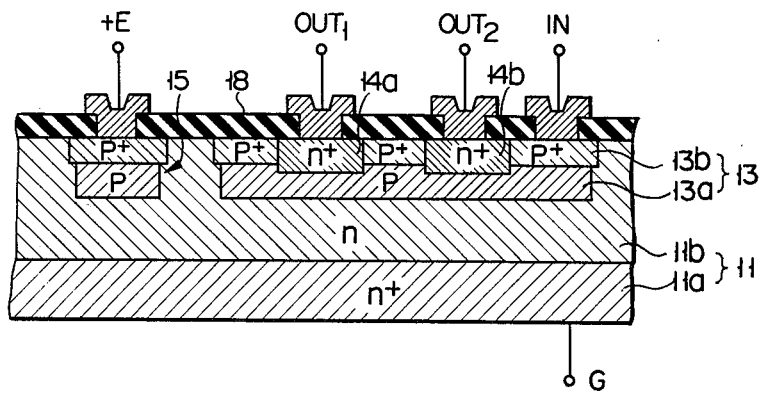
FIG. 3 is a sectional view of a semiconductor device according to an embodiment of the invention.

In FIG. 3, a substrate 11 of a first conductivity type is composed of an $n+$ layer 11a and $n$ layer 11b, said $n+$ layer 11a being connected to a ground terminal G through a not shown electrode. A signal input region 13 of a second conductivity type (P) is provided in the $n$ layer 11b. In this signal input region, signal output regions of the first conductivity type (n), for example, $n+$ regions 14a, 14b, are provided. The signal input region 13 is composed of a first region 13a and a second region 13b ($p+$) having the same conductivity type as that of the first region 13a ($p$) and a higher concentration than the same 13a ($p$), said second region 13b being directly adjoined to the respective outer peripheries of the signal output regions 14a, 14b and connected to a signal input electrode 1N. The signal output regions 14a, 14b are connected to signal output regions $OUT_1$, $OUT_2$, respectively. On the other hand, a charge injection region 15 composed of $p$ and $p+$ layers of the second conductivity type is provided in the n layer 11b closely to the signal input region 13 and is connected to a charge injection electrode $+E$. The difference between the embodiment shown in FIG. 3 and the prior art semiconductor device shown in FIG. 1 resides in the respect that the signal input region 3 of FIG. 1 is constituted by a single p region whereas the signal input region 13 of FIG. 3 is constituted by the $p$ region 13a and $p+$ region 13b. The equivalent circuit shown in FIG. 2 applies also to the device of FIG. 3.

Figure 4A:
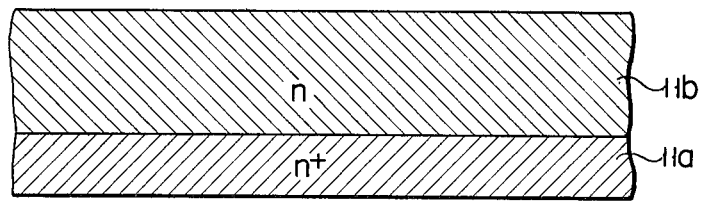
FIGS. 4A to 4D are views for explaining, respectively, the steps of manufacturing the device shown in FIG. 3.
Figure 4B:
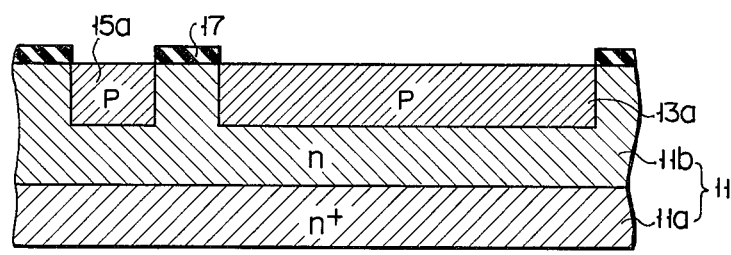
Figure 4C:
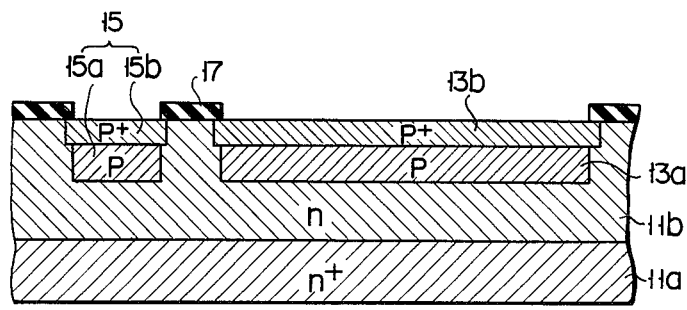
Figure 4D:
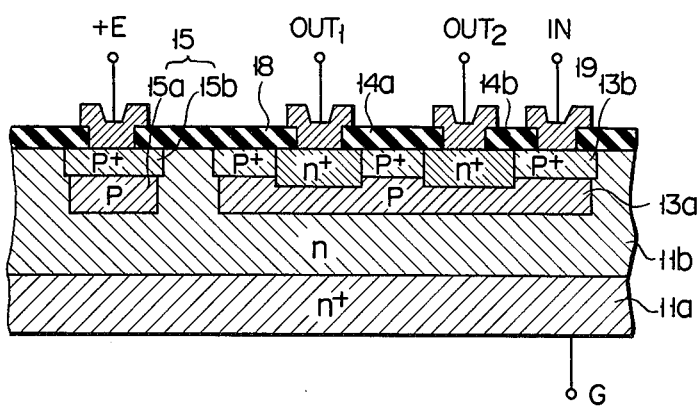

An example of the manufacturing process of the device shown in FIG. 3 will now be explained by reference to FIGS. 4A to 4D. As shown in FIG. 4A, on an $n+$ substrate 11a having an impurity concentration of about $10^{18}/cm^3$ is first formed by a vapor phase growth method an $n$ layer 11b having an impurity concentration of about $10^{14}/cm^3$ and a thickness of about 5μ. Next, as shown in FIG. 4B, a mask is formed on the n layer 11b by the use of a $SiO_2$ mask 17 and thereafter $p$ layers 13a, 15a having an impurity concentration of about $10^{16}/cm^3$ and a depth of about 3μ are formed by impurity diffusion. At this time, the p layers 13a and 15a have their surface impurity concentration of about $10^{17}/cm^3$. Next, as shown in FIG. 4C, high-concentration impurity diffusion is effected with the mask left as it stands to form on the p layers 13a, 15a $p+$ layers 13b, 15b having an impurity concentration of $10^{19}$ to $10^{20}/cm^3$ and a depth of about 1μ. Next, another mask (not shown) is formed by the use of, for example, a $SiO_2$ film and thereafter, as shown in FIG. 4D, $n+$ layers 14a, 14b and 15b having an impurity concentration of about $10^{20}$ to $10^{21}/cm^3$ and a depth of about 2μ are formed in the $p+$ layer 13b and p layer 15a by impurity diffusion. Next, after forming a protective film, for example, a $SiO_2$ film 18 on the entire surface of the resulting device, the film at those positions at which electrodes are to be provided is formed with bores by a known technique, respectively, and thereafter, for example, aluminum is deposited on the whole surface of the device and thereafter unnecessary portions of the deposited aluminum are removed to form electrodes IN, $OUT_1$, $OUT_2$ and $+E$.

Figure 5:
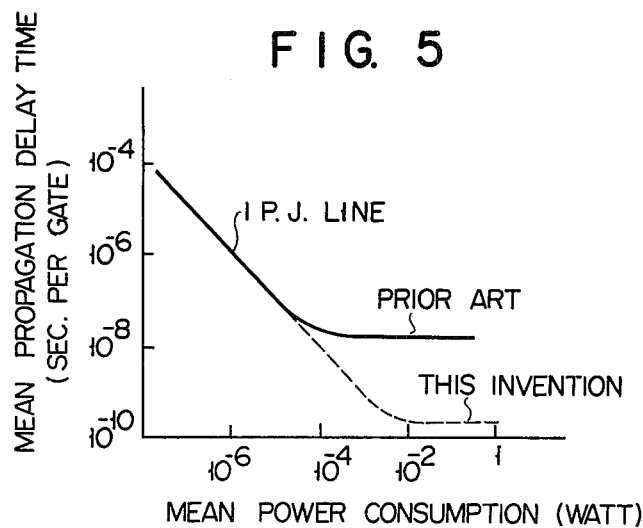
FIG. 5 shows, by way of comparison, the relationships between the respective power consumptions and propagation delay times of the prior art device of FIG. 1 and the present device of FIG. 3.

In the device shown in FIG. 3, the signal input region 13 is composed of the $p$ layer 13a and the high-concentration $p+$ layer 13b provided on the $p$ layer, and the signal input electrode IN is provided on the $p+$ layer 13b. Therefore, the lateral resistance of the signal input region 13 is largely reduced as compared with the conventional device. Accordingly, the time period, during which the input signal is to be propagated through the signal output region, is shortened. In other words, the signal propagation delay time is decreased to a great extent. For instance, FIG. 5 shows that as the power consumption is increased, the signal propagation delay time is proportionately reduced. As seen from FIG. 5, in the prior art case, the delay time indicates, as shown by solid lines, no more decay in the range of $10^{-7}$ to $10^{-8}$ seconds, whereas in the case of this invention the delay time is saturated, as denoted by dotted lines, in the range of $10^{-9}$ to $10^{-10}$ to obtain a device in which the delay time to be saturated is on the sub-nanosecond order. This saturation corresponds to that in the case of an ECL (Emitter Coupled Logic). Further, in the case of the prior art device, where a plurality of output regions are provided, there arises a problem that the points of time when the input signal reaches the output regions differ. According to the invention, however, the lateral resistance of the signal input region becomes extremely small and therefore there is no possibility that the said points of time are made substantially different. More in detail, according to the invention, since, in the upside-down operated transistor $Q_1$, the resistance of its base becomes small, the resistance between the emitter and base also becomes small; and as the signal input region is composed of the $p$ layer 13a and $p+$ layer 13b, the capacitance between the emitter and base becomes small.

In that first modification of the invention shown in FIG. 6, the thickness of the second region 13b of the signal input region 13 is made larger than that of the signal output regions 14a, 14b, and the underside surface of the signal output regions 14a, 14b is adjoined directly to the second region 13b. Though, in FIG. 6, the charge injection region 15a is wholly formed into a $p+$ type region, it is completely equivalent to the injection region 15 of FIG. 3. The operation and effect of this modification are the same as those of the embodiment shown in FIG. 3.

In that second modification of the invention shown in FIGS. 7A, 7B and 7C, two $p+$ regions (second region of the input region) are so formed as to exist between three parallel $p$ regions (first region of the input region). The signal output regions 14a, 14b are formed in the central exposed $p$ region. Accordingly, the regions 14a, 14b have respective parts of their side faces adjoined directly to the second region ($p+$) and have their bottom surfaces adjoined directly to the first region ($p$). The operation and effect of this modification are the same as those of the embodiment shown in FIG. 3.

Figure 8:
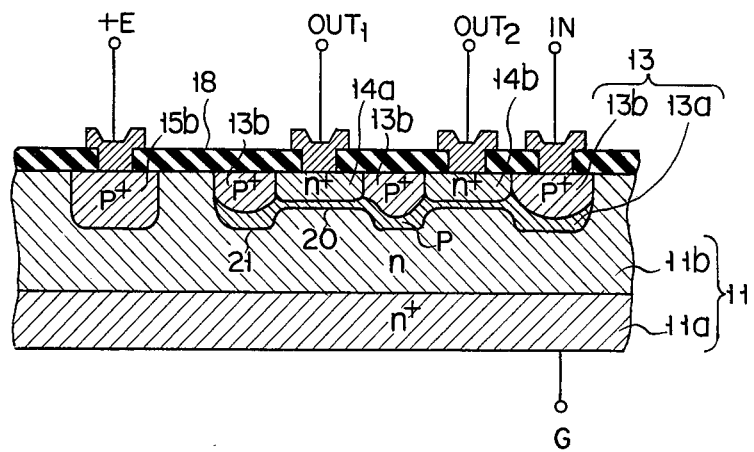
FIG. 8 is a sectional view showing a third modification of the present device.

A third modification of the invention shown in FIG. 8 is a one prepared by further modifying the embodiment shown in FIG. 3. The second region 13b ($p+$) of the signal input region 13 surrounds the respective side faces of the signal output regions 14a, 14b and the thickness of this second region 13b is greater than that of the signal output regions 14a, 14b. The boundary between the underside of the first region 13a ($p$) of the signal input region 13 and the substrate 11 does not take a linear form, and a first boundary 20 opposed to the underside of the signal output regions 14a, 14b assumes a wavy shape so as to become nearer to the surface of the semiconductor device than a second boundary 21 opposed to the underside of the second region 13b ($p+$) enclosing the side faces of the signal output regions 14a, 14b. For this reason, according to this modification, the operation and effect of the embodiment shown in FIG. 3 can be much more improved.

Figure 9:
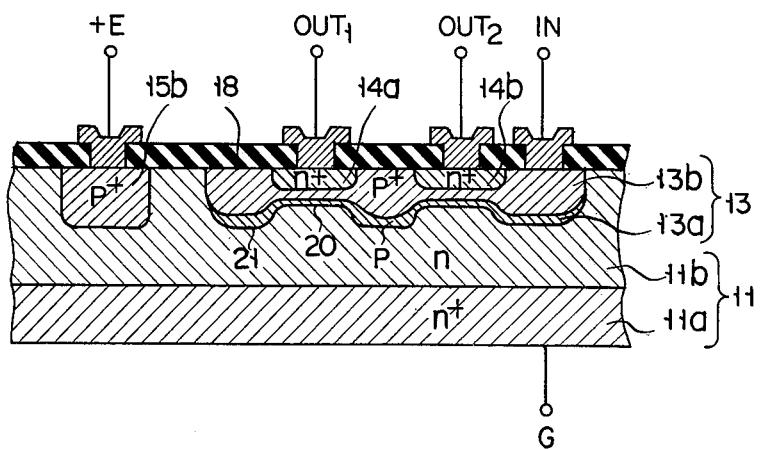
FIG. 9 is a sectional view showing a fourth modification of the present device.

FIG. 9 shows a further modification of the invention, and the difference between this modification and the modification shown in FIG. 8 lies in the respect that, in FIG. 9, the underside of the signal output regions 14a, 14b is adjoined directly to the second region 13b (p+) of the signal input region 13. Namely, the second region 13b (p+) of the signal input region 13 surrounds the side faces and the undersides of the signal output regions 14a, 14b, and the thickness of those portions of the second region 13b which surround the said side faces is greater than the sum of the thickness of a second-region portion adjoined directly to the underside of said output regions 14a, 14b and the thickness of the signal output regions 14a, 14b. The boundary between the underside of the first region 13a (p) of the signal input region 13 and the substrate 11 is not linear, and the first boundary 20 opposed to the underside of the signal output regions 14a, 14b takes a wavy form so as to become nearer to the surface of the semiconductor device than the second boundary 21 faced to the underside of the second region 13b (p+) surrounding the side faces of the signal output regions 14a, 14b. According to this modification, the operation and effect of the embodiment of FIG. 3 can be improved to a greater extent.

In the above-mentioned embodiment and modifications, the charge injection region 15 or 15a was so formed as to be made flush with the signal input region 13 and the signal output regions 14a, 14b. But this charge injection region 15 or 15a can be constructed so as to oppose the signal input region 13 in the depth direction of the substrate. Further, obviously, the injector transistor (FIG. 2-$Q_2$) and the inverter transistor (FIG. 2-$Q_1$) can of course be modified into an npn type and a pnp type, respectively.

What is claimed is:

1. A semiconductor device for integrated injection logic comprising a semiconductor substrate of a first conductivity type, a signal input region of a second conductivity type provided in said semiconductor layer of said first conductivity type, at least one signal output region of said first conductivity type formed in said signal input region, a charge injection region of said second conductivity type of high impurity concentration provided closely to said signal input region and forming a pn junction with said semiconductor substrate of said first conductivity type, and electrodes provided for said substrate, signal input region, signal output regions and charge injection region, respectively, wheretby an inverted signal of an input signal is obtained by applying a forward bias voltage to said pn junction, said signal input region including a first portion of said second conductivity type having a lower impurity concentration than said charge injection region and a second portion having the same conductivity type as said first portion and having a higher impurity concentration than said first portion, said second portion being adjoined directly to said signal output region and connected to said signal input electrode, and said first portion being adjoined directly to at least the entire under surface of said portion.

2. A semiconductor device according to claim 1, wherein the thickness of said second portion of said signal input region is smaller than that of said signal output region.

3. A semiconductor device according to claim 1, wherein the thickness of said second portion of said signal input region is greater than that of said signal output region, said second portion being adjoined to a side face and an underside of said signal output region.

4. A semiconductor device according to claim 1, wherein said first portion and second portion of said signal input region are so disposed as to permit their respective upper and lower surfaces to everywhere interface at the same level, and said signal output region is so disposed that its lower surface is substantially at the same level; whereby part of its side face is adjoined directly to said second portion and the remaining part thereof is adjoined directly to said first portion.

5. A semiconductor device according to claim 1, said second portion of said signal input region surrounds the side face of said signal output region and is thicker than said signal output region; and of the interfaces between said semiconductor substrate and the underside of said first portion of said signal input region a first interface opposed to the underside of said signal output region is situated nearer to the surface of said semiconductor device than a second interface opposed to the underside of said second portion of said signal input region.

6. A semiconductor device according to claim 1, wherein said second portion of said signal input region surrounds the side face and underside of said signal output region, and the thickness of that part of said second portion which surrounds said side face of said signal output region is greater than the sum of the thickness of that portion of said second portion which surrounds said underside of said signal output region and the thickness of said signal output region; and of the interfaces between said semiconductor substrate and the underside of said first portion of said signal input region a first interface opposed to the underside of said signal output region is situated nearer to the surface of said semiconductor device than a second interface opposed to the underside of that second portion of said signal input region which surrounds the side face of said signal output region.

* * * * *